United States Patent [19]

Shibata et al.

[11] Patent Number: 4,531,287
[45] Date of Patent: Jul. 30, 1985

[54] AUTOMATICALLY OPERATING ELECTRIC SHAVER

[75] Inventors: Minoru Shibata, Tokyo, Japan; Koichi Hayashi, Dover Heights, Australia; Katsumi Abe, Shiba, Japan

[73] Assignee: U.S. Philips Corporation, New York, N.Y.

[21] Appl. No.: 609,242

[22] Filed: May 11, 1984

[30] Foreign Application Priority Data

May 25, 1983 [JP] Japan .......................... 58-77445[U]

[51] Int. Cl.³ ............................................. B26B 19/38
[52] U.S. Cl. ........................................ 30/43.6; 30/90; 30/34 R; 200/DIG. 1
[58] Field of Search ................... 200/DIG. 1, DIG. 2; 30/34 R, 43.6, 90

[56] References Cited

U.S. PATENT DOCUMENTS

| | | | |
|---|---|---|---|
| 2,848,659 | 8/1958 | Cutler | 200/DIG. 1 |
| 3,109,893 | 11/1963 | Burns | 200/DIG. 1 |
| 3,568,313 | 3/1971 | Hutter | 30/43.6 |
| 4,242,799 | 1/1981 | Kameyama | 30/90 |
| 4,380,121 | 4/1983 | Naimer | 30/90 |

FOREIGN PATENT DOCUMENTS 3120142 12/1982 Fed. Rep. of Germany ....... 30/43.6

Primary Examiner—Jimmy C. Peters
Attorney, Agent, or Firm—William J. Streeter; Rolf E. Schneider

[57] ABSTRACT

An automatically operating electric shaver comprising a housing provided with a shaving head, said housing comprising a power source part and a motor. Furthermore there is provided a starting preliminary circuit which operates by detecting external contact resistance, a proximity detecting circuit which operates by detecting changes in capacity between electrodes for detecting proximity and a motor drive circuit which operates only when both of the afore-mentioned circuits operate and that the construction is such that the shaver starts automatically in a prescribed position and stops automatically in any positions remote from the said position.

6 Claims, 3 Drawing Figures

AUTOMATICALLY OPERATING ELECTRIC SHAVER

The invention concerns an automatically operating electric shaver comprising a housing provided with a shaving head, said housing comprising a power source and a motor. Such an automatically operating electric shaver starts automatically to provide an adequate rate of rotation in the prescribed use position and stops automatically when removed from this position without the use of a mechanical ON-OFF switch on the electric shaver.

Virtually all conventional electric shavers involve causing a motor to operate and drive the shaver blades by operating a mechanical ON-OFF switch by hand.

An electric shaver of the type without a manual mechanical switch has been described for example in British Pat. No. 2,074,332 A. Thereby one electrically conductive part is established in the housing of the shaver and another electrically conductive part is formed by the metal of the cutter surface of the shaver and using these two electrically conductive parts as detecting probes, the electrical resistance of the skin is detected when the surface of the shaver makes contact with the users skin and this operates a switch electrically.

With the already known shaver the starting circuit for the motor is such that it starts after the metal part of the shaver has made contact with the users skin and since the motor starts to rotate at this time, shaving commences before the motor has reached its full speed, so that the hair is not cut properly and there is a risk of so-called hair pulling. An object of the invention is to avoid this disadvantage.

This is achieved by a shaver of the above-mentioned type which is characterized in that there are provided a starting preliminary circuit which operates by detecting an external contact resistance, a proximity detecting circuit which operates by detecting changes in capacity between electrodes for detecting proximity, and a motor drive circuit which operates only when both of the aforementioned circuits operate, and in that the construction is such that the shaver starts automatically in a prescribed position and stops automatically in any positions remote from the said position.

Thus the proximity of the skin in the shaving position is detected and the motor is started so that the motor has achieved full speed when it reaches the shaving position.

Particular embodiments of the invention are mentioned in the sub-claims.

The invention will be described below with reference to the drawings.

Figure 1:
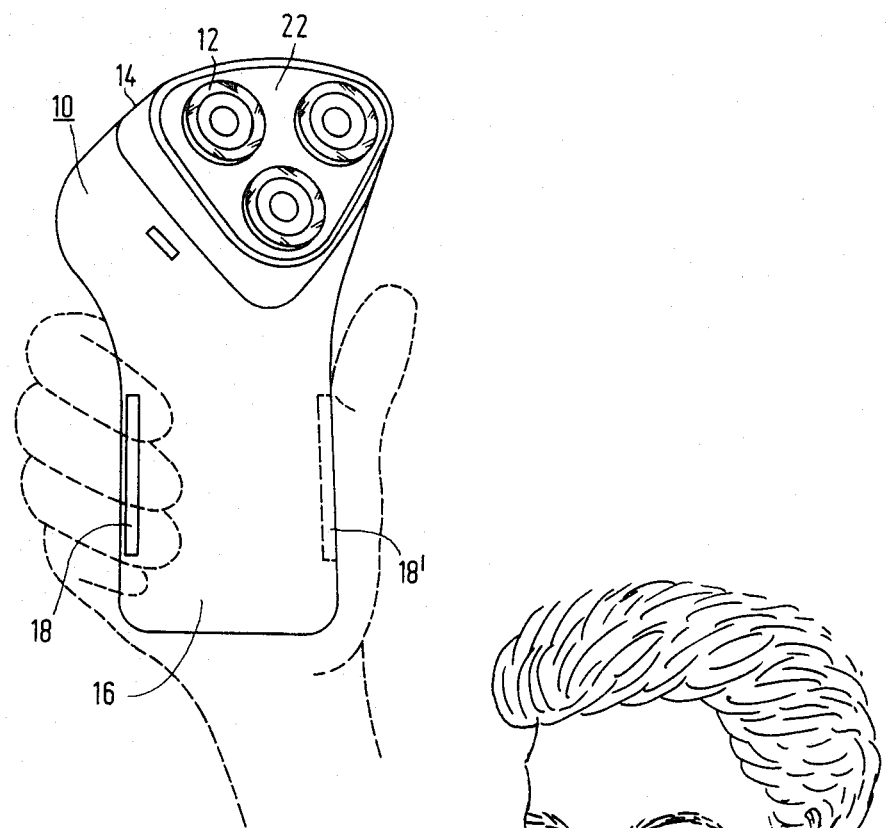
FIG. 1 is an oblique view showing the external appearance of a shaver of this invention.

In FIG. 1, 10 is the shaver housing, 12 is the general shaving head and 14 is the bracket. In this design the bracket 14 can be for the main part an insulator but part 22 of the bracket forming the front surface is one of the electrodes for detecting proximity. How this functions will be explained later.

Furthermore, in this embodiment a pair of electrically conductive grip electrodes 18, 18' which are sensitive to contact with the hands etc. are established on both sides of the handle part 16 of the housing of the shaver and they may be made to protrude a little from the handle. When these electrodes are gripped in the hand the resistance due to contact with the body is sensed and this presets the operating circuit.

Figure 2:
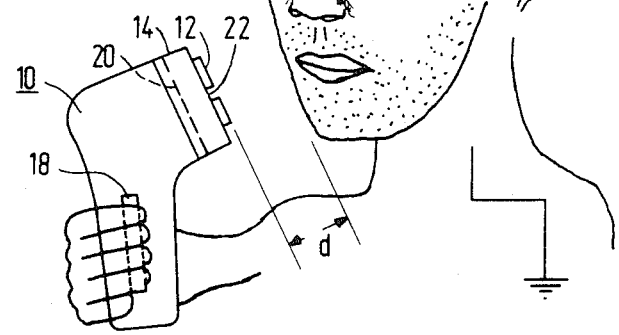
FIG. 2 is an outline drawing which shows the shaver in use.

FIG. 2 shows the shaver housing 10 being grasped in the hand and placed in proximity to the shaving position. In this case, when the shaving head 12 reaches the prescribed proximity detecting distance d, which is approximately some 10–15 mm from the shaving position where the shaver contacts the jaw for example, the electrostatic capacity between the electrode 22 for detecting proximity on the front surface of the bracket 14 and a facing electrode 20 for detecting proximity which is established internally is affected by the capacity of the approaching human body. The equilibrium state of a bridge circuit to which the oscillation frequency of the internal oscillating circuit of the shaver is supplied is altered and this is converted as a change in the output and supplied from the detecting circuit to a Schmitt trigger circuit. Thus the motor starting circuit which includes a switching transistor is started and shaving is carried out in the shaving position with the motor rotating at the optimum speed.

When the shaver is removed from the shaving position and the distance becomes greater than d, the aforementioned electrostatic capacity once again assumes the value at which the bridge is at equilibrium and the motor stops automatically.

Figure 3:
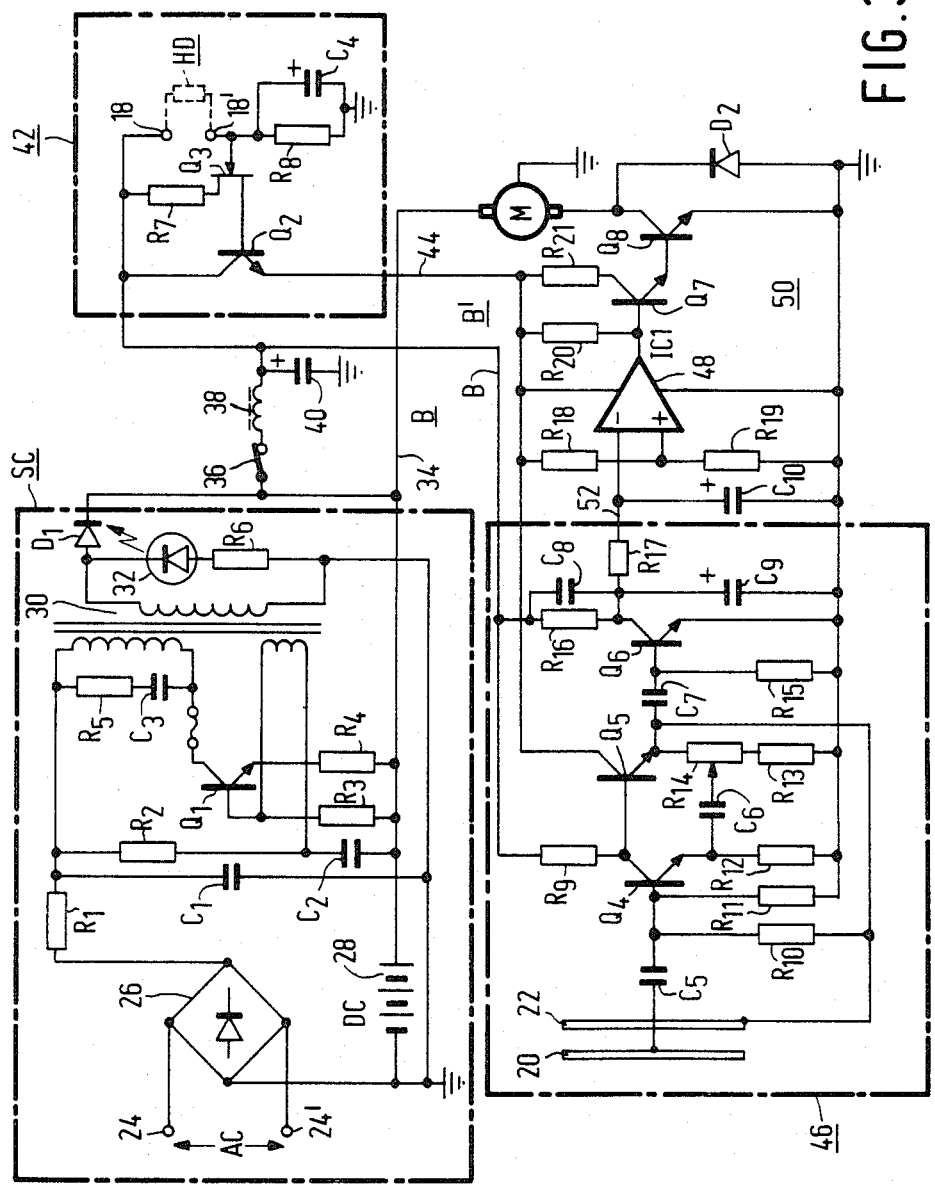
FIG. 3 shows an example of an electric circuit for this shaver.

In FIG. 3, SC is the power source circuit and this may be AC or DC. In the diagram 24 and 24' are terminals for an AC input and when these are connected to an AC power supply the rechargeable battery 28 is charged via the rectifier 26, the transistor $Q_1$ and its auxiliary circuits and a DC voltage B is produced in the DC output line 34. Apart from the transformer 30, the circuit shown includes the resistances $R_1$-$R_6$, the condensers $C_1$-$C_3$ and the diode $D_1$ etc but the shaver can also be operated with a dry battery in place of these. 32 is an indicating lamp.

The power source circuit SC of FIG. 3 charges the battery 28 from the AC circuit when the AC power supply is connected, lights the lamp 32 for indication and provides a DC power source from the AC side in the output line 34.

42 is the starting preliminary circuit. As required, a protective cap switch 36, a noise suppressing indicator 38 (10 $\nu\mu H$) and a condenser 40 (10 $\mu F$) are provided between the power source circuit SC and when the protective cap (not shown in the drawing) is fitted the switch 36 is opened so that the shaver 10 will not operate.

18 and 18' in the starting preliminary circuit are a pair of grip electrodes as described in connection with FIG. 1. A resistance HD, which is shown by a dotted line, is the resistance due to contact with the hand for example.

When the contact resistance HD is connected between the electrodes 18, 18' the starting preliminary voltage B' is supplied to the 40 output line 44 by the operation of the transistors $Q_3$ and $Q_2$.

46 shows the proximity detecting circuit. With the supply of the afore-mentioned starting preliminary voltage B', the transistors $Q_4$ and $Q_5$ produce an oscillation of frequency 1 MHz for example and this frequency is applied across the proximity detecting electrodes 20 and 22. The electrostatic capacity between these electrodes is in series with the fixed capacity $C_5$ and is supplied to the equilibrium bridge which is formed with the resistances $R_{10}$-$R_{14}$. When the electrodes 20 and 22 approach within about 10-15 mm (d) of the shaving position the capacity between the two electrodes is increased by the capacity between the human body which is at earth potential and the two electrodes, the balance of the bridge is disturbed and this is detected by the circuit of the transistor $Q_6$. The detection voltage is sent to the Schmitt trigger 48 via the line 52 and operates the motor drive circuit 50 which includes this trigger circuit and the switching transistors $Q_7$ and $Q_8$.

The equilibrium condition of the bridge can be adjusted by the variable resistance $R_{14}$.

As a result of this the drive motor M of the shaver is driven by the circuit of the switching transistor $Q_8$ with the voltage B of the power source output line 34.

As described above, the proximity detecting circuit 46 operates just before the shaving position is reached and, since the motor is driven precisely by the drive circuit which includes the Schmitt trigger 48, the motor is running at full speed in the shaving position and there is no incomplete cutting of the hair or so-called hair pulling.

Furthermore, because of the grip electrodes in the starting preliminary circuits 42 the shaver will not operate in error when the shaver is simply placed on a metal desk for example.

A shaver according to the above will only operate when it is gripped and placed in the shaving position so there is an additional psychological effect in that shaving becomes interesting and can be enjoyed.

Thus an electric shaving is provided in which the motor starts automatically at a prescribed starting position immediately before the shaving position so that an adequate speed is achieved in the shaving positions without the use of a mechanical ON-OFF switch of this sort, in which the means for an ON-OFF switch are omitted and which stops automatically when removed beyond the afore-mentioned starting position. It thus provides an electric shaver which conserves energy.

1. An automatically operating electric shaver comprising a housing provided with a shaving head, said housing comprising a power source and a motor, characterized in that there are provided a starting preliminary circuit which operates by detecting an external contact resistance, a proximity detecting circuit which operates by detecting changes in capacity between electrodes for detecting proximity, and a motor drive circuit which operates only when both of the afore-mentioned circuits operate, and in that the construction is such that the shaver starts automatically in a prescribed position and stops automatically in any positions remote from the said position.

2. A shaver as claimed in claim 1, characterized in that the afore-mentioned starting preliminary circuit has a pair of conductivity type grip electrodes on the walls of the housing of the shaver.

3. A shaver as claimed in claim 1, characterized in that the front face of a bracket of the shaving head and a facing internal electrode form the electrodes of the proximity detecting circuit.

4. A shaver as claimed in claim 1, characterized in that the proximity detecting circuit has an equilibrium bridge circuit such that the equilibrium state of the said bridge is eliminated and a change is produced in the output by a change in the capacity between the electrodes for detecting proximity.

5. A shaver as claimed in claim 1, characterized in that a Schmitt trigger circuit is provided in the motor drive circuit.

6. A shaver as claimed in claim 1, characterized in that a cap switch is provided on the output side of the power source circuit.

* * * * *